(12) United States Patent
Reeder

(10) Patent No.: US 9,062,386 B2
(45) Date of Patent: Jun. 23, 2015

(54) METHODS OF MULTI-SHOT INJECTION MOLDING AND METAL-PLATED POLYMERIC ARTICLES MADE THEREFROM

(75) Inventor: David Reeder, Grand Blanc, MI (US)

(73) Assignee: SRG Global, Inc., Warren, MI (US)

( * ) Notice: Subject to any disclaimer, the term of this patent is extended or adjusted under 35 U.S.C. 154(b) by 708 days.

(21) Appl. No.: 13/407,060

(22) Filed: Feb. 28, 2012

(65) Prior Publication Data
US 2012/0225255 A1    Sep. 6, 2012

Related U.S. Application Data

(60) Provisional application No. 61/448,077, filed on Mar. 1, 2011.

(51) Int. Cl.
*B32B 3/00* (2006.01)
*C25D 5/14* (2006.01)
(Continued)

(52) U.S. Cl.
CPC ........... *C25D 5/14* (2013.01); *Y10T 428/24612* (2015.01); *Y10T 428/24917* (2015.01); *B29C 45/0053* (2013.01); *B29C 45/16* (2013.01); *B29C 2045/0079* (2013.01); *C23C 18/1608* (2013.01); *C23C 18/1641* (2013.01); *C23C 18/1653* (2013.01); *C23C 18/24* (2013.01); *C25D 5/02* (2013.01); *C23C 14/042* (2013.01); *C23C 14/20* (2013.01)

(58) Field of Classification Search
CPC .............. B32B 3/00; B32B 3/02; B32B 3/08; B32B 3/10; B32B 3/30; B32B 15/00; B32B 2451/00; C25D 5/02; C25D 5/56

USPC ................ 428/31, 156, 167, 172, 195.1, 209, 428/913.3
See application file for complete search history.

(56) References Cited

U.S. PATENT DOCUMENTS 6,264,869 B1 * 7/2001 Notarpietro et al. .......... 264/247
6,504,189 B1    1/2003 Matsuda et al.
(Continued)

FOREIGN PATENT DOCUMENTS

EP    2651615 A2    10/2013
EP    2651616 A2    10/2013
(Continued)

OTHER PUBLICATIONS

International Search Report and Written Opinion for PCT/US2012/027061, Int'l Filing Date: Feb. 29, 2012.
(Continued)

*Primary Examiner* — Catherine A Simone
(74) *Attorney, Agent, or Firm* — Harness, Dickey & Pierce, PLC

(57) ABSTRACT

Molded metallized polymeric components are formed by methods of multi-shot injection molding of a first resin and a second resin, where the first resin forms a first polymer that is metal-platable and the second resin forms a second polymer that is colored and resistant to metallization. Select regions corresponding to the metal-platable polymer surface are metallized. Further, one or more interface regions between the first metal-platable polymer and the second colored polymer can be concealed from a visible direction. Molded decorative polymeric components formed from such methods are also provided.

12 Claims, 9 Drawing Sheets

(51) Int. Cl.
- *B29C 45/00* (2006.01)
- *B29C 45/16* (2006.01)
- *C23C 18/16* (2006.01)
- *C23C 18/24* (2006.01)
- *C25D 5/02* (2006.01)
- *C23C 14/04* (2006.01)
- *C23C 14/20* (2006.01)

(56) References Cited

U.S. PATENT DOCUMENTS

| | | |
|---|---|---|
| 6,652,943 B2 | 11/2003 | Tukachinsky et al. |
| 7,396,147 B2 | 7/2008 | Munro |
| 7,514,147 B2 | 4/2009 | Davis et al. |
| 7,607,147 B1 | 10/2009 | Lu et al. |
| 7,607,942 B1 | 10/2009 | Van Swearingen |
| 7,837,048 B2 | 11/2010 | Lusker |
| 2003/0170460 A1 | 9/2003 | Sienkiewicz et al. |
| 2004/0138075 A1 | 7/2004 | Brown et al. |
| 2005/0003208 A1 | 1/2005 | Graf et al. |
| 2005/0285303 A1 | 12/2005 | Balint et al. |
| 2006/0135679 A1 | 6/2006 | Winowiecki et al. |
| 2006/0154027 A1 | 7/2006 | Dry |
| 2006/0231231 A1 | 10/2006 | McCullough |
| 2007/0246852 A1 | 10/2007 | DeBiasi et al. |
| 2009/0117398 A1 | 5/2009 | Helmstetter et al. |
| 2009/0174121 A1 | 7/2009 | Hayes et al. |
| 2010/0255325 A1 | 10/2010 | Elia et al. |
| 2012/0156442 A1 | 6/2012 | Reeder |
| 2012/0156443 A1 | 6/2012 | Reeder |
| 2012/0164398 A1 | 6/2012 | Reeder |

FOREIGN PATENT DOCUMENTS

| | | |
|---|---|---|
| EP | 2681029 A2 | 1/2014 |
| JP | 59184228 A | 10/1984 |
| JP | 2002241988 A | 8/2002 |
| JP | 2008290295 A | 12/2008 |
| WO | 02064862 A2 | 8/2002 |
| WO | 2012083003 A2 | 6/2012 |
| WO | 2012083007 A2 | 6/2012 |
| WO | 2012118875 A2 | 9/2012 |

OTHER PUBLICATIONS

Bannerjee, Ashis Gopal, et al., "Incorporating manufacturability considerations during design of injection molded multimaterial objects," Res. Eng. Design, vol. 17, pp. 207-231 (2007) (published online Feb. 21, 2007).

"Cycolac* MG37EPX Resin," SABIC Innovative Plastics (Dec. 14, 2010) (2 pages).

"Cycolac* MG37EPX Resin," Prospector, IDES—The Plastics Web (created Dec. 14, 2010; updated Aug. 6, 2010) (2 pages).

"Plexiglas® V825 acrylic resin," Altuglas International, Arkema Inc. (Jan. 2009) (1 page).

"SABIC Innovative Plastics Cycoloy MC1300 PC+ABS," matweb.com (Dec. 14, 2010) (2 pages).

The International Preliminary Report on Patentability issued on Sep. 3, 2013 for PCT International App. No. PCT/US2012/027061 (Pub. No. WO 2012/118875).

The International Search Report and Written Opinion issued on Aug. 22, 2012 for PCT International App. No. PCT/US2011/065119 (Pub. No. WO 2012/083003).

The International Preliminary Report on Patentability issued on Jun. 18, 2013 for PCT International App. No. PCT/US2011/065119 (Pub. No. WO 2012/083003).

The International Search Report and Written Opinion issued on Aug. 22, 2012 for PCT International App. No. PCT/US2011/065126 (Pub. No. WO 2012/083007).

The International Preliminary Report on Patentability issued on Jun. 18, 2013 for PCT International App. No. PCT/US2011/065126 (Pub. No. WO 2012/083007).

* cited by examiner

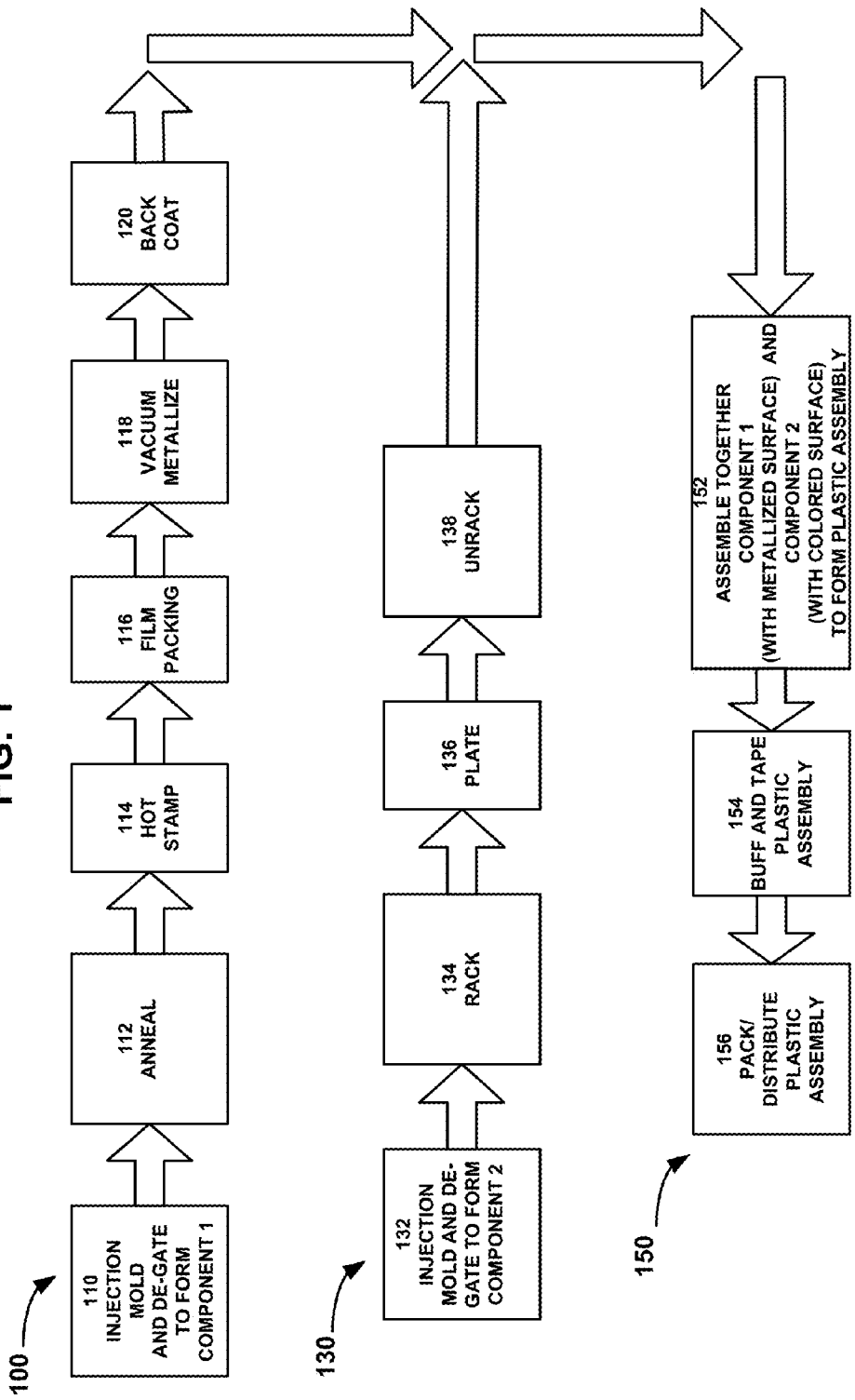

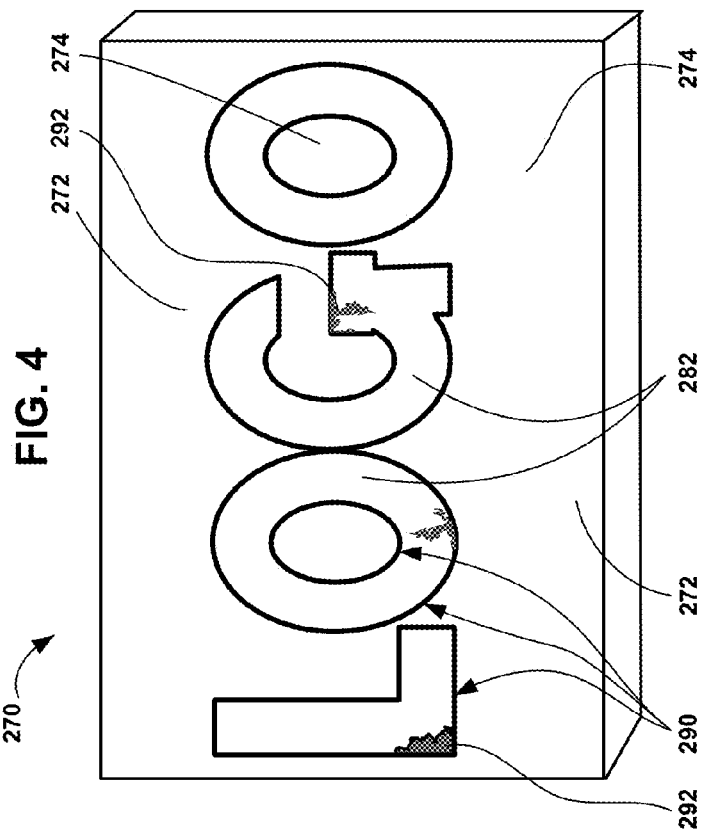
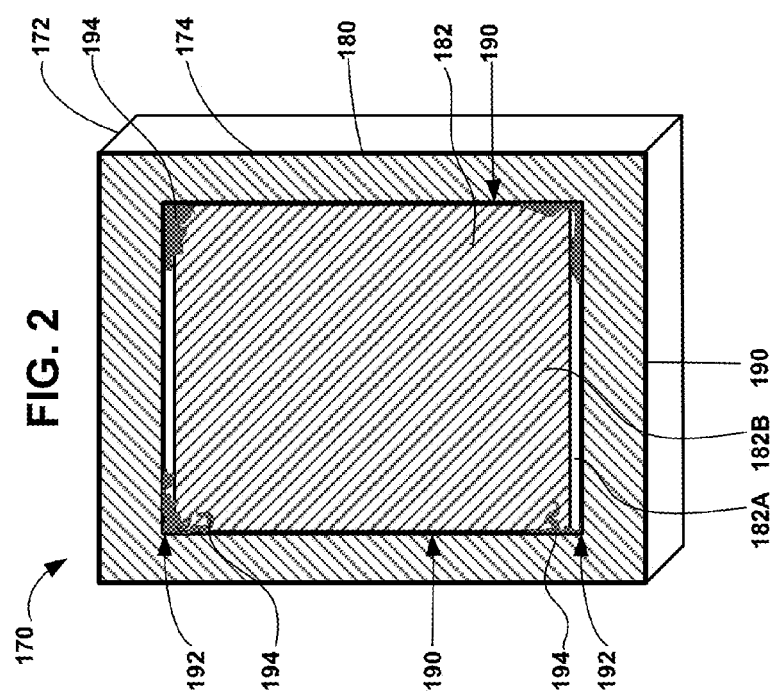

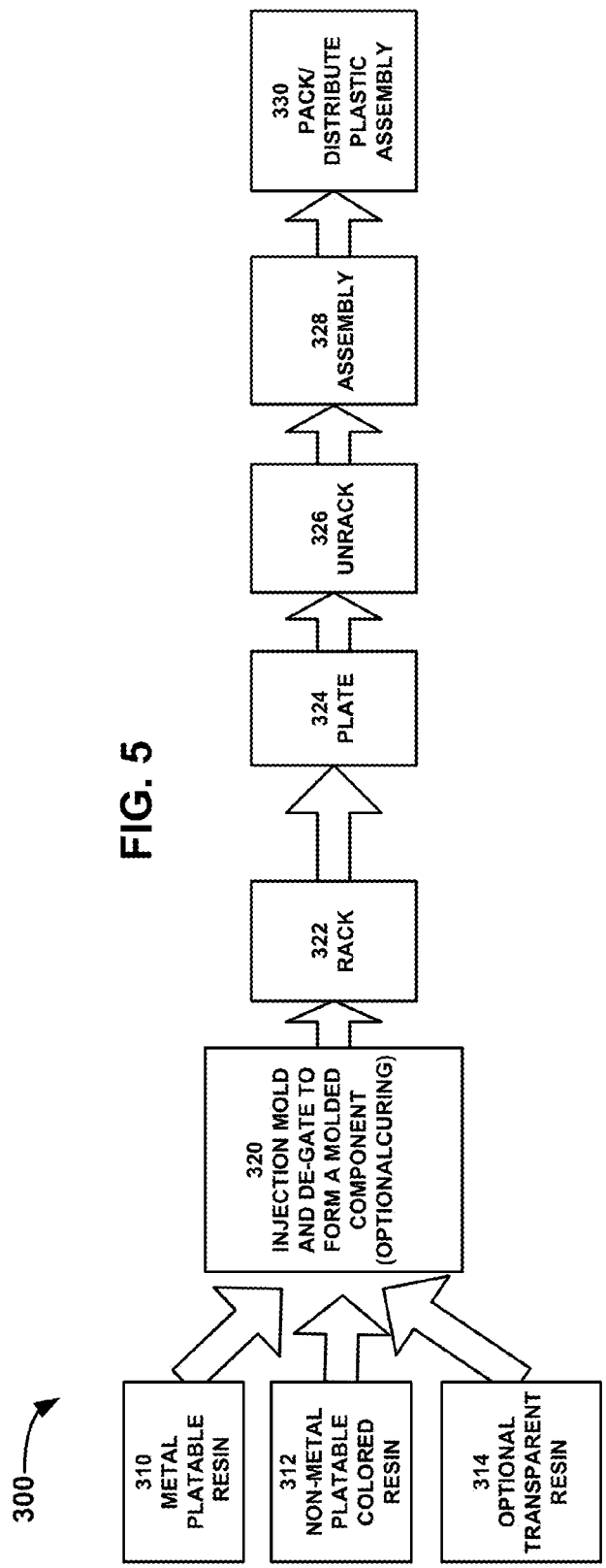

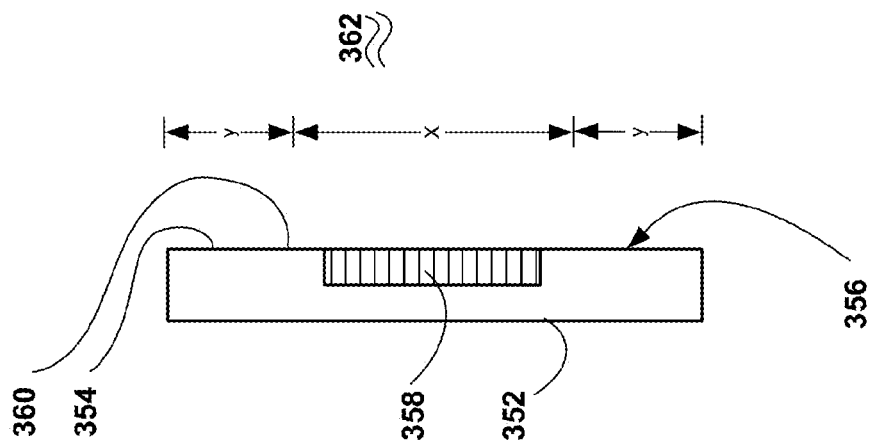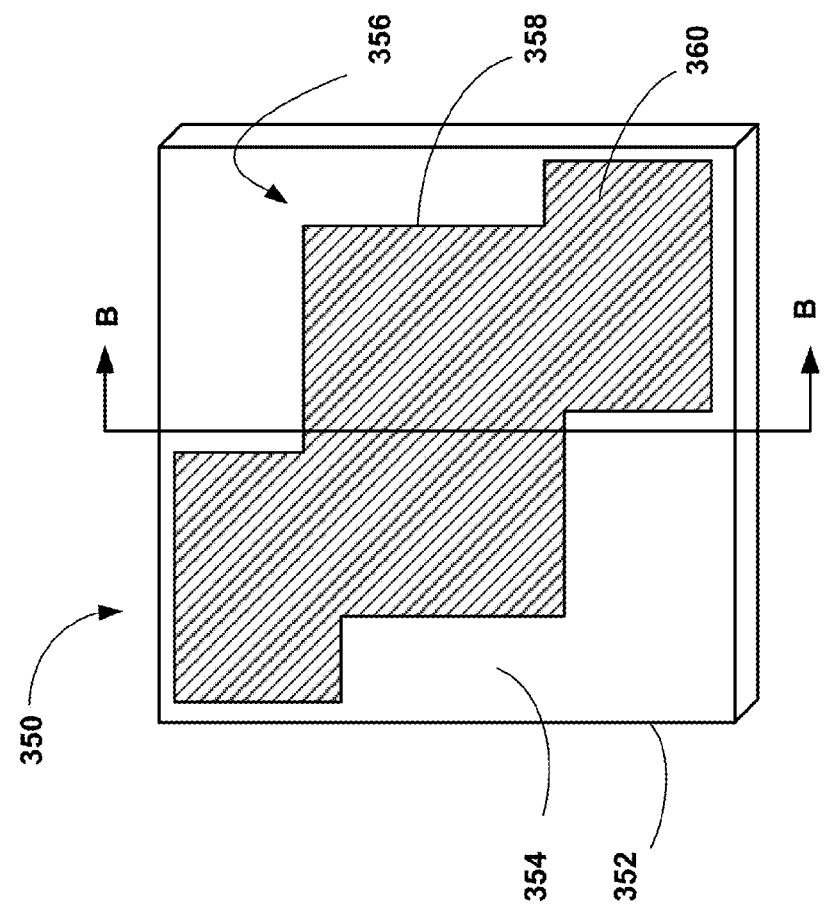

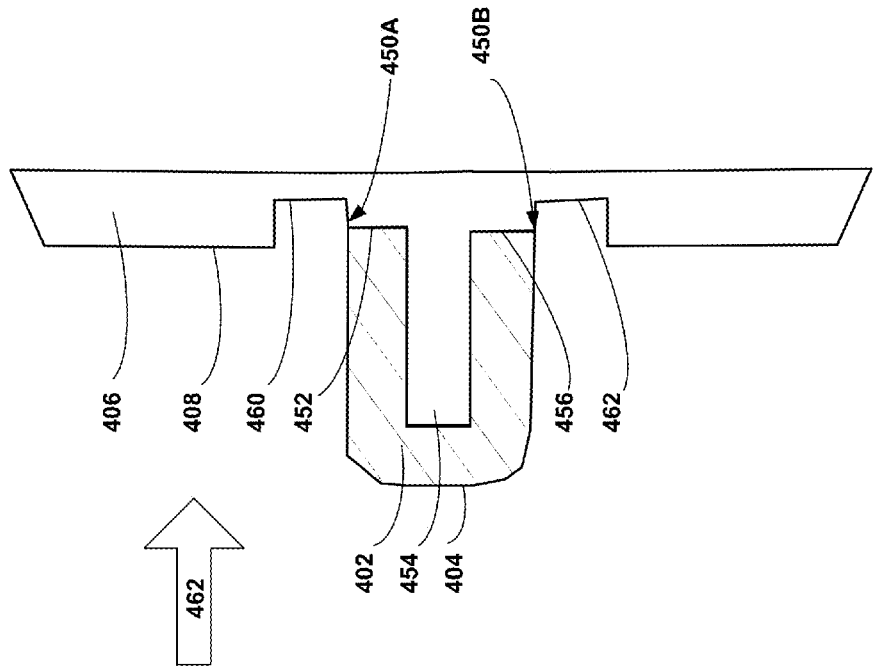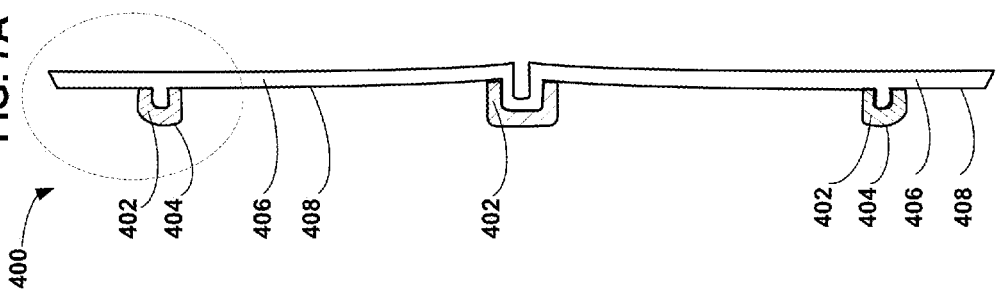

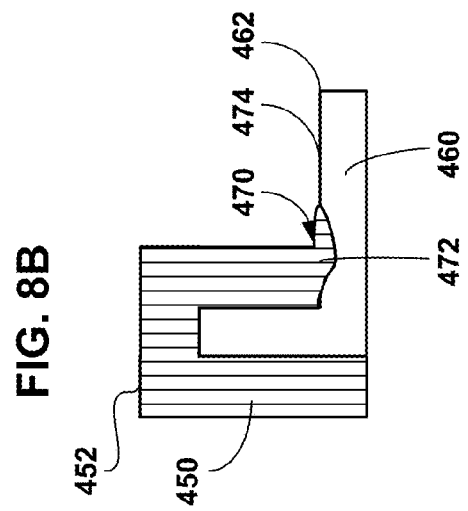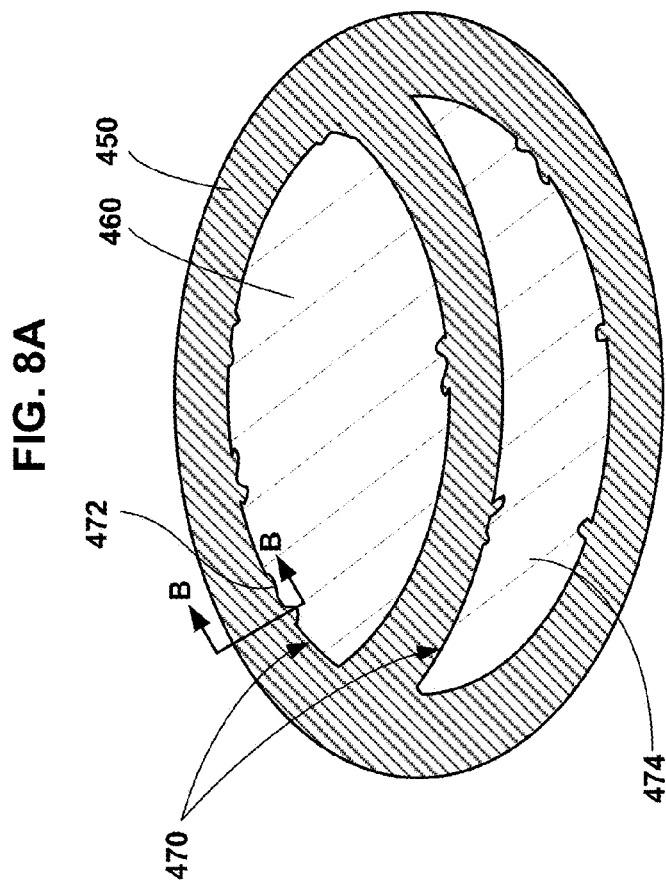

METHODS OF MULTI-SHOT INJECTION MOLDING AND METAL-PLATED POLYMERIC ARTICLES MADE THEREFROM

CROSS-REFERENCE TO RELATED APPLICATIONS

This application claims the benefit of U.S. Provisional Application No. 61/448,077, filed on Mar. 1, 2011. The entire disclosure of the above application is incorporated herein by reference.

FIELD

The present disclosure relates to methods of multi-shot injection molding and metal plating polymeric articles made therefrom.

BACKGROUND

This section provides background information related to the present disclosure which is not necessarily prior art.

Plastic materials are used in a wide variety of applications. For example, many plastic components are used in vehicles, such as automobiles, to provide reduced weight, cost, and increased corrosion resistance advantages, among other benefits. Accordingly, plastic materials are often used as decorative components, for example, in detailing and trim features or as indicia of brands, logos, emblems, and the like. It should be noted that such decorative components are used in a wide variety of applications, such as consumer goods, appliances, reflector components, and the like, and are not limited to merely vehicles. Many such plastic components have multiple surface finishes in a single component, such as a combination of one or more colored surface finishes and one or more metallic surface finishes. Desirably these types of components are durable, yet have an aesthetically pleasing appearance.

Currently, when a decorative molded polymeric component requires two distinct different surface finishes, such as a metallic surface (e.g., chrome finish) and one or more colored surfaces, the components are molded separately and then later assembled together. Thus, in conventional processes, a first component having a metallic surface finish is prepared and then joined with a second component having a colored surface in a sub-assembly process. By joining such distinct components together, the potential exists for gaps to occur along seams, edges, or joints, so that upon exposure to weather or other corrosive conditions, potential corrosion may occur to the multi-surface plastic component. Because plastic decorative components may be used in applications where they are exposed to an external environment, including extreme weather conditions and exposure to UV radiation or corrosive agents, such plastic components may suffer from degradation or corrosion.

It would be desirable to develop a decorative molded polymeric component, particularly those having at least one metallized surface finish and at least one non-metallized surface finish, which can be produced in a streamlined process, while having greater robustness, quality aesthetics, durability, and corrosion resistance, for example.

SUMMARY

This section provides a general summary of the disclosure, and is not a comprehensive disclosure of its full scope or all of its features.

In various aspects, the present disclosure provides methods for forming a molded metallized polymeric component. Such a molded metallized polymeric component may be a decorative component, for example. In certain variations, a molded metallized polymeric component comprises one or more metallized surface regions formed on a first injection-molded polymer that is metal-platable. The molded metalized polymeric component also comprises one or more colored surface regions defined by a second injection-molded polymer that is colored and resistant to metallization. The first injection-molded polymer and the second injection-molded polymer are integrally formed with one another. At least one concealed interface region is formed where the first injection-molded polymer contacts the second injection-molded polymer. The concealed interface region(s) can hide any potential aesthetic defects formed at a boundary between the first injection-molded polymer and the second injection-molded polymer.

In other aspects, the present teachings provide a method of forming a molded metallized polymeric component. The method comprises multi-shot injection molding of a first resin and a second resin. The first resin forms a first polymer that is metal-platable, while the second resin forms a second polymer that is resistant to metallization. Further, at least one interface region is created where the first polymer contacts the second polymer, which is concealed from a visible direction. The concealed interface region hides any potential aesthetic defects formed at a boundary between the first polymer and the second polymer. Further, the method comprises metallizing one or more regions of the first polymer. One or more colored non-metallized regions are defined by the second polymer, so that together, the first and second polymer forms the molded metallized polymeric component.

In yet other aspects, the present disclosure provides a decorative molded metallized polymeric component, which comprises one or more metallized visible surface regions formed on a first injection-molded polymer that comprise a chrome finish. The decorative molded metallized polymeric component also comprises one or more colored visible surface regions defined by a second injection-molded polymer that is colored and resistant to metallization. In certain aspects, the first injection-molded polymer is desirably selected from the group consisting of: acrylonitrile-butadiene-styrene (ABS), acrylonitrile-butadiene-styrene/polycarbonate (ABS/PC), and combinations thereof. Likewise, in certain aspects, the second injection-molded polymer is desirably selected from the group consisting of: a polycarbonate polymer (PC), an acrylic polymer, an acrylic copolymer, a methacrylic polymer, a methacrylic copolymer, and combinations thereof. The decorative molded metallized polymeric component further comprises one or more interface regions that are formed where the first injection-molded polymer contacts the second injection-molded polymer. These interface regions are configured in such a manner that they are concealed from a visible direction, thereby concealing any potential aesthetic defects formed at the boundary between the first and second injection-molded polymers.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 1 shows a process flow diagram of a first conventional process for forming a decorative plastic component having metallized and colored surfaces;

FIG. 2 shows a first conventional decorative plastic component having a surface with both metallized and colored regions formed by the first conventional process in FIG. 1, which is suffering from degradation and/or corrosion in one or more regions;

FIG. 4 shows a second conventional decorative plastic component having a surface with both metallized and colored regions (where the metallized regions are in the form of indicia of the letters "LOGO") formed by the second conventional process of FIG. 3, which is suffering from degradation and/or corrosion in one or more regions;

FIG. 5 is a process flow diagram for forming a decorative plastic component having a metallized surface finish and colored regions according to certain aspects of the present teachings;

FIGS. 6A-6B show an embodiment of a decorative plastic multi-polymeric component having a metallized surface finish and colored regions formed according to certain aspects of the present teachings. FIG. 6A is a plan view of such a decorative component and FIG. 6B is a cross-sectional view taken along line B-B in FIG. 6A;

Figure 9B:
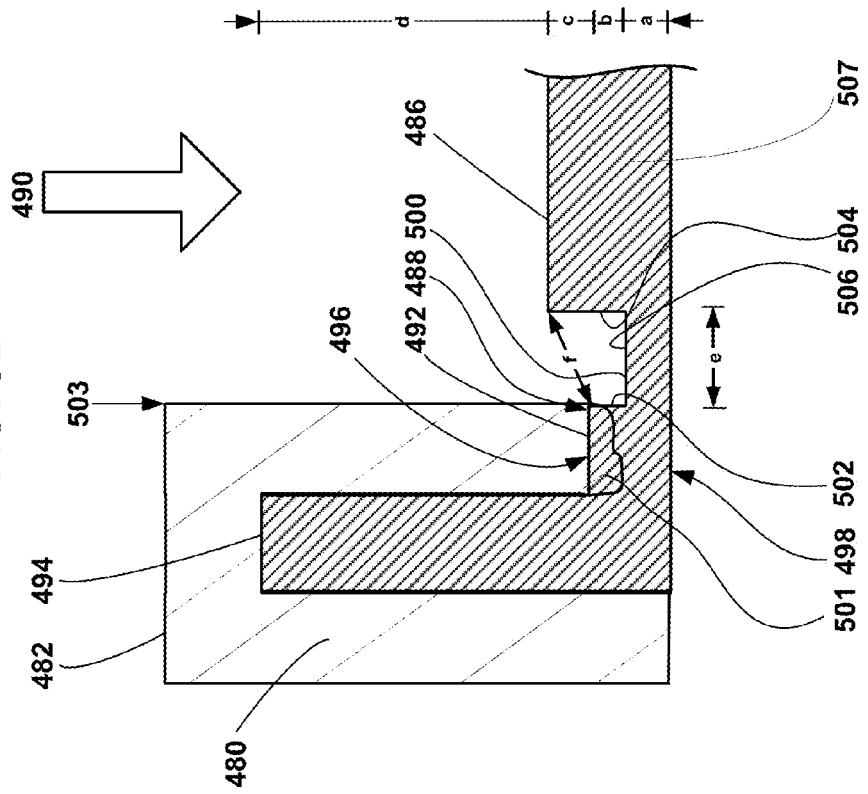
Figure 9A:
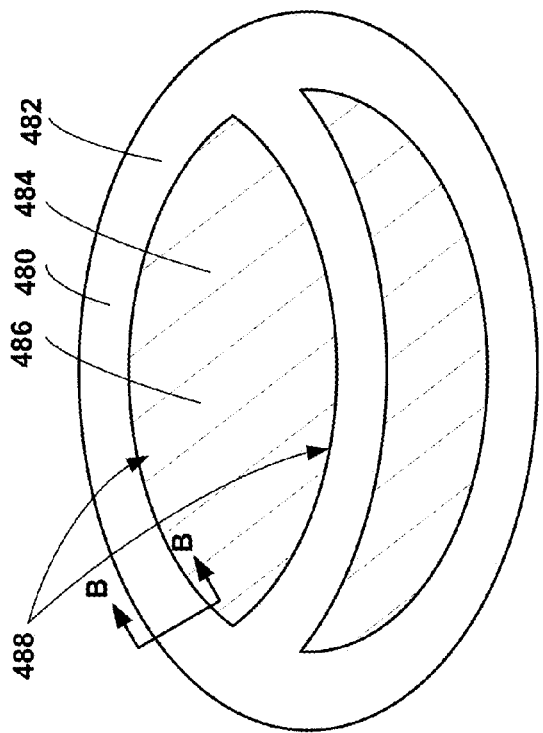
Figure 10:
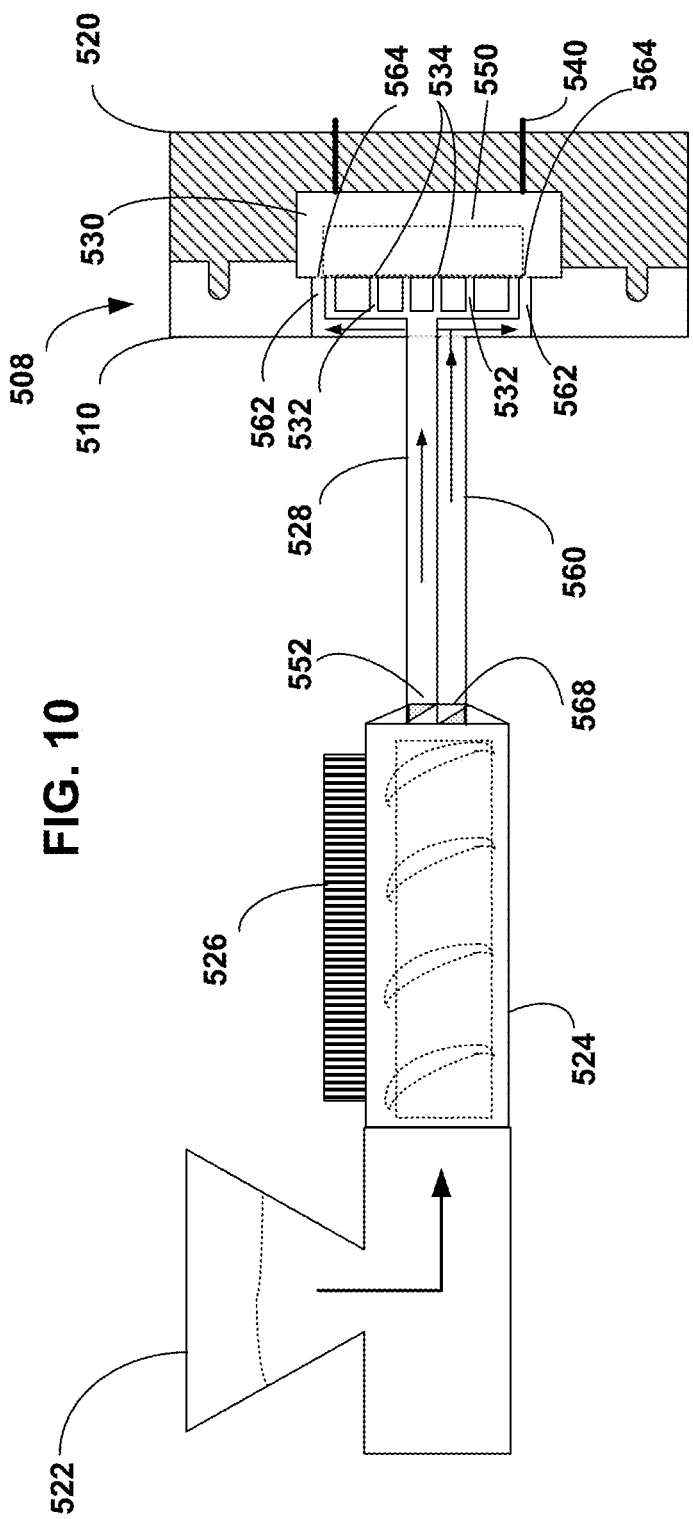

FIGS. 7A-7B show a sectional view of a decorative plastic component according to certain aspects of the present teachings having a surface with both metallized and colored regions formed by the first conventional process with a first injection-molded polymer that has a metallized surface and a second distinct injection-molded polymer that is resistant to metallization and forms colored surface regions. FIG. 7B is a detailed view of a terminal end of the component in FIG. 7A, showing interface regions between the first and second injection-molded polymers that are concealed from a visible direction;

FIGS. 8A-8B show an injection molded component having a surface with both metallized and colored regions formed by the first conventional process with a first injection-molded polymer that has a metallized surface and a second distinct injection-molded polymer that is resistant to metallization and forms colored surface regions, where an interface region between the first and second injection-molded polymers is not concealed in a visible direction; FIG. 8B is a cross-sectional view taken along line B-B in FIG. 8A; and FIGS. 9A-9B show an injection molded component having a surface with both metallized and colored regions formed by the first conventional process with a first injection-molded polymer that has a metallized surface and a second distinct injection-molded polymer that is resistant to metallization and forms colored surface regions, where an interface region formed between the first and second injection-molded polymers is configured to be concealed in a visible direction; FIG. 9B is a cross-sectional view taken along line B-B in FIG. 9A showing on embodiment of the present teachings having a concealed interface region; and FIG. 10 is an exemplary schematic showing a multi-shot polymer injection molding apparatus.

Corresponding reference numerals indicate corresponding parts throughout the several views of the drawings.

DETAILED DESCRIPTION

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," and the like). As used herein, the term "and/or" includes any and all combinations of one or more of the associated listed items.

Although the terms first, second, third, and the like may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The inventive technology pertains to an improved, streamlined process to make improved plastic components having both metallized and non-metallized surface regions. In preferred aspects, the non-metallized surface regions are colored. Further, the inventive technology includes the polymeric articles, such as decorative components, formed from such processes, as will be described in greater detail below. For a better understanding of the present teachings, a discussion of conventional processing techniques for forming plastic components (in particular those having a surface with at least one region defining a metallized surface and at least one region defining a colored non-metallized surface) is as follows.

In one type of conventional process, such as that shown in FIG. 1, a first plastic or polymeric component is formed in a first process 100 and a second plastic or polymeric component is formed in a second distinct process 130. Later, the first plastic component and second plastic component are assembled together in a third process 150. In these processes, a simplified version of conventional processing steps is shown (omitting certain routine work-in-progress steps, where the component is stored to permit the completion of cooling, drying after processing, and the like). Thus, a conventional process 100 includes forming a first molded component that comprises a polymer by first injection molding the component (including optional curing or cross-linking while in the mold assembly) and de-gating it from a mold assembly at 110. Then, the first polymeric component is annealed at 112 (by heating to a temperature below the melting point of the injection-molded polymer to relieve internal stress) and hot-stamped at 114. Hot-stamping applies one or more paint films or surface finishes, such as a black paint film, by stamping such a film to heated regions of a surface of the first component. Next, the first component is subjected to a film packaging step 116, where a masking film (optionally having a pattern with regions to be protected) is applied to a surface of the first component (for example, by pulling a vacuum to apply the film to the surface).

After applying the masking film in 116, one or more regions of the surface of the first component are vacuum metallized 118. Vacuum metallizing is a common process well known to those of skill in the art for creating a metallized finish on plastic surfaces, such as a chrome surface finish on a polymeric component. Thermal evaporation, also commonly referred to as vacuum metallizing, is the most common physical vapor deposition (PVD) process used to apply metals and/or metal alloys under vacuum conditions. During the vacuum metallizing process, a metal or metal alloy, such as aluminum, is evaporated in a vacuum chamber, which condenses on and bonds to the surfaces of the plastic parts to form a uniform metallized surface layer.

After the metallizing takes place, a protective back coat is applied to the metallized surface regions at 120. Dyes and pigments can be added to such a back coat to modify the metallic finish color or appearance, for example, to change a shiny chrome finish to have a gold, nickel, bronze, copper, or gunmetal, color, for example. Thus, the first component having a metallized surface finish (formed via vacuum metallization) along with a colored region (from the hot stamping) is ready for assembly with a second component processed as discussed below.

In a second process 130, a second molded polymeric component is formed by injection molding a polymer resin (optionally cured or cross-linked) and de-gating it at 132. The second polymeric component is then arranged on a rack 134 and then subjected to a metal plating process 136, whereby one or more surface regions on the second polymeric component have a metallic appearance. By way of example, the surface to be plated can be etched, followed by optional electroless deposition of one or more layers and/or electroplating of one or more layers of metal-containing materials. The second component having one or more plated surfaces is then removed from the rack 138 and is ready for assembly with the first component having one or more metallized surface regions from process 100. It should be noted that both the first component and second component have metallized surfaces, although the first component also has a hot-stamped colored finish, as well.

In a third process 150, the first component and second component are assembled together 152 via a conventional assembly process. For example, as shown in FIG. 2, an exemplary plastic decorative component 170 is shown, including a frame or bezel 172 and a lens 180. If the first component is a lens 180 and the second component is the bezel 172 that surrounds lens 180, the bezel 172 and lens 180 can be placed in contact with one another and joined together. Optionally, an adhesive or other material (not shown) is disposed in one or more joint regions 190 between the first and second components 172, 180 to form an assembly that is the plastic decorative component 170. In certain variations, this assembly step may further include curing or cross-linking (for example, by room temperature vulcanization).

As shown in FIG. 1, the assembly can then be finished, for example, by buffing the finished surfaces (to remove any rough edges) and applying a tape or other adhesive to one or more surfaces, so that the assembly can be attached and coupled to a substrate in its final use 154. Finally, the assembled decorative component is packed for distribution at 156.

Figure 3:
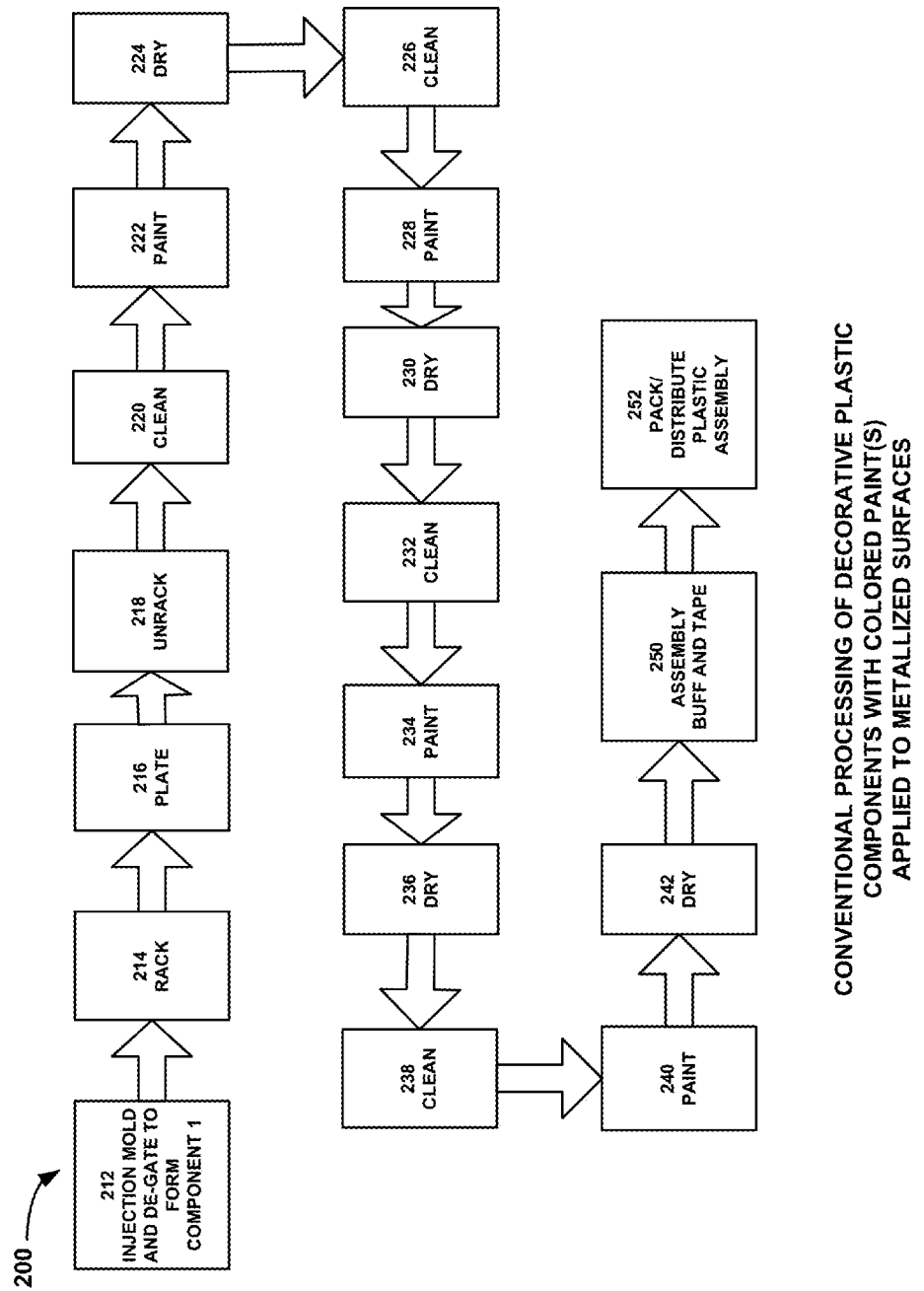
FIG. 3 is a process flow diagram of a second conventional process for forming a decorative plastic component having a metallized surface finish and colored regions applied by painting over the metallized surface finish.

Yet another conventional process to form decorative plastic components (having both a metallized surface and a colored surface) is shown in FIG. 3, where a surface of the component is first metallized and then one or more colored paints are applied over the metallized surface. FIG. 3 shows such an exemplary conventional process 200. The polymeric component is formed by injection molding a polymer resin (optionally cross-linking) and de-gating it at 212. The polymeric component is then arranged on a rack 214 for further processing. The polymeric component on the rack is then subjected to a plating process 216, whereby one or more surfaces of the plastic component have a metallized surface appearance, such as a chrome finish. Such a plating process is similar to the plating process 136 described in the context of FIG. 1, where the surface of the polymeric component to be metallized can be subjected to a direct wet chemistry process, where the surface is etched and subjected to electroless and electrolytic plating processes.

By way of example, one particularly suitable metallization process includes a direct wet chemistry metallization process that includes wet etching, followed by an electroless plating process, and then a sequence of electroplating baths. Such a direct wet chemistry process can apply a chrome metal finish to the plastic surface. In one variation, etching is conducted by immersing the surface of the plastic component (or entire plastic component, for example, the rack holding the plastic component) in an etching solution comprising chromium (e.g., Cr (VI)) and sulfuric acid. After etching, the surface of the plastic component to be metallized (or the entire component itself) is subjected to an electroless plating process, which is an auto-catalytic process that applies a thin conductive metal layer (for example, a thin nickel-containing or copper-containing layer) onto the etched plastic surface, without the use of electric current.

After electroless deposition of such a conductive metal layer, the surface to be plated can be further subjected to wet chemistry metallic processing, which is well known in the art. One exemplary wet chemistry electroplating process to form a chrome-plated surface on the plastic component includes electroplating first one or more copper layers (Cu) over the electroless-deposited layer (comprising for example, a conductive metal like nickel and/or copper), followed by electroplating a nickel layer (Ni) and then a chromium (Cr) layer.

After plating, the polymeric component having one or more plated surfaces is then removed from the rack 218. Next, the polymeric component is cleaned 220, painted 222, and dried 224. In order to provide good adherence of paint over the metallized surface, one or more paints are applied to a surface of the polymeric component shortly after the metallizing process, preferably within 24 hours or less of metallizing the surface. Thus, the surface of the polymeric component can be cleaned with an alcohol solvent at 220, followed by painting with a conventional paint like an exterior body paint. In conventional processing, such paints are usually applied multiple times to ensure good paint coverage and adhesion or to apply distinct colors to the surface. For example, in a conventional process, the cleaning, painting, and drying steps are repeated another three times. See cleaning, painting, and drying steps 226, 228, 230; 232, 234, 236; and 238, 240, and 242, respectively. Then, the processed component can be finished and assembled 250, for example, by buffing the finished surfaces and optionally taping one or more surfaces of the component to ensure its adhesion to a substrate for end use. Finally, the assembled decorative component is packed for distribution at 252.

Decorative polymeric parts formed by the conventional processes shown in FIGS. 1 and 3 require a relatively large number of processing steps, which in addition to requiring greater material resources and energy, also require significant tooling and processing times. In process 200 where paint is applied over a metallized surface on the injection-molded part, it can be difficult to process such a part successfully, both due to the short/tight process window (to apply paint within a short time of metallization of the surface) and to control the environment during application of paint, including carefully controlling temperature and humidity, which can have a significant impact on paint adhesion to the underlying metallized surface.

Furthermore, it has been observed that decorative components formed by the multi-part assembly and vacuum metallization/plating processing (processes 100, 130, and 150) in FIG. 1 and the paint applied over metal-plated surfaces formed by the process 200 of FIG. 3 have the potential to suffer from environmental degradation, solvent attack, peeling, and/or delamination issues. For example, in an automotive application, a decorative component of the vehicle may be coupled to the vehicle and then subjected to final processing and finishing steps, often including applying a water-repellant material over the entire external surface of a vehicle, such as the commercially available RainX™ material. Such a material usually contains solvents and thus, has the ability to penetrate any seams, joints, or edges in the decorative plastic component providing the potential for corrosive agents to degrade the decorative surfaces. Further, when exposed to environmental conditions, corrosive elements may penetrate the decorative component's edges, seams, or joints, which likewise have the potential to cause unacceptable degradation of one or more surfaces of the decorative component.

Such corrosive attack or degradation is shown in the exemplary schematic of FIG. 2. FIG. 2 is a decorative plastic component 170 formed by a process like that described in conjunction with FIG. 1 (processes 100, 130, and 150) discussed above. In this exemplary emblem, a decorative component 170 comprises a bezel or frame 172 having a first surface finish 174. The decorative component 170 also has a central lens 180 having a second surface finish 182. The first and second surface finishes 174, 182 may be distinct from one another, for example, a colored surface finish and a metallized surface finish. As described above, the central lens 180 has a second surface finish 182 that includes two distinct surface finishes, including a colored surface finish (e.g., hot-stamped colored surface) 182A and a metallized surface finish (e.g., vacuum-metallized surface) 182B. The bezel 172 has a first surface finish 174 that is a metallic finish (e.g., plated metal).

A joint 190 is formed between the frame 172 and lens 180, where the pieces are joined and assembled together to form the decorative component 170. As shown in FIG. 2, at the corner regions 192 of the joint 190, the second surface finish 182 is suffering from corrosive attack (shown as delaminated or corroded regions 194). Such corrosive attack may occur anywhere along the surface and is not limited to the regions shown in FIG. 2, but tends to occur at joints, seams, or edges between distinct components (e.g., between frame and lens 172, 180). Further, the decorative plastic component may have far more complex shapes and designs than those shown in FIG. 2 and may include additional components or pieces; therefore such corrosive attack may occur in a variety of locations.

Similarly, decorative components formed via the processes discussed in conjunction with FIG. 3, where paint is applied over a metallized surface suffer from similar corrosive attack or delamination, as shown in the representative design of FIG. 4. An exemplary decorative plastic component 270 comprises a major surface 272 having one or more regions 274 with a first surface finish, such as a metallized surface finish (e.g., formed by plating). As appreciated by the discussion above, such a metallized finish can be applied to cover the entire major surface 272 or may be applied in discrete or distinct surface regions. The major surface 272 also has a second surface finish 282 formed in one or more regions (here in the regions designated "LOGO"). The second surface finish 282 can be applied over the first metallized surface finish 274 by masking, so that only the regions where the second surface finish 282 is to be formed are contacted with paint during the painting process. The second surface finish 282 may be a colored surface formed by applying one or more layers of paint over the metallized surface finish 274. Further, multiple distinct paint colors can be applied to form the second surface finish 282. Further, the second surface finish 282 may include a plurality of different paint colors.

Several edges 290 are formed at the interfaces between the first metallized surface finish 274 and the second painted surface finish 282 along the surface 272. As shown in FIG. 4, certain regions of the edges 290 (between the first and second surface finishes 274, 282) are suffering from degradation and/or corrosive attack (shown as peeling/delaminated regions 292). Such degradation may occur at any location, especially at joints, seams, or edges, and is not limited to the embodiment shown here. Similar to the decorative component of FIG. 2, the decorative component 270 is merely exemplary and may have far more complex shapes and designs; therefore such corrosive attack may occur in a variety of regions corresponding to the complex design.

In view of some of the potential shortcomings of the conventional processing techniques for forming decorative plastic components having at least two distinct surface finishes (e.g., a colored non-metallized surface finish and a metallized surface finish), the present teachings provide a streamlined and more efficient process for forming such decorative components having improved robustness and durability, while exhibiting diminished susceptibility to degradation or corrosive attack. In certain variations, the improved processes eliminate the need for separate formation processes and separate tooling for forming plastic components with both metallized and non-metallized surface finishes, and can potentially eliminate the need for masks, racks, and the like. Further, in certain aspects, the inventive processes can eliminate sub-assembly processes required by conventional formation techniques. This eliminates any potential issues with fit and finish, for example, reducing any potential squeaks or rattles between sub-components of an assembly. Additionally, decorative components formed from the various processes of the present disclosure have reduced susceptibility to chemical attack and can eliminate potential peeling and delamination of the metallized finish or alternatively, the colored surface finish applied to a metallized surface finish. Furthermore, in accordance with certain aspects of the present teachings, decorative components are formed improved quality and enhanced aesthetics with complex designs.

In various aspects, the present disclosure provides a polymeric component, such as a decorative molded polymeric component, comprising a surface having one or more metallized surface regions and one or more non-metallized colored regions. By "metallized" it is meant that the surface of the plastic has a metallic surface finish or metallic appearance and in preferred aspects, comprises a metallic material containing one or more metals or metal alloys. A surface having one or more of such metallized regions includes an entire major surface of the plastic component being covered with a metallic material (so that a single metallized region covers an entire surface) or may include discrete and distinct regions (either contiguous or non-contiguous regions) of metallic material along the surface. A "non-metallized" surface region is one that has minimal metal present or that is substantially free of metal, so that the surface region does not appear to have a metallic surface finish or metallic appearance, in contrast to the metallized surface regions. In certain preferred aspects, the non-metallized surface region has a colored surface finish (or multiple colored surface finishes) that may include coverage of an entire major surface, but also includes partial surface coverage, including both contiguous and non-contiguous colored surface regions.

In various embodiments, metallized surface regions are formed over a first polymer that is metallizable, such as a metal-platable polymer. In yet other aspects, the non-metallized surface regions are formed and defined by a polymer that is resistant to metallization, in particular resistant to metal deposition during a metallization process. Metallization can include deposition of a metal selected from the group of non-limiting metals: copper, iron, zinc, cobalt, palladium, chromium, magnesium, manganese, cadmium, niobium, molybdenum, gold, palladium, nickel, tungsten, and combinations thereof. As will be discussed in greater detail below, in certain embodiments, the metallized surface region has a chrome appearance and includes deposition of metals selected from the group consisting of: nickel, copper, chromium, and combinations thereof. In addition to deposition of metallic elements, a non-metallic element can be co-deposited with the metal (for example phosphorous or boron). In certain aspects, the metallization process is a metal-plating process, such as a preferred direct wet metallization chemistry process. The metallization can be carried out by first etching the surface of the polymeric component to be metallized followed by immersion in a bath of a metallization liquid composition (solution, dispersion, gel, emulsion, and the like) with or without an electrical current.

In various embodiments, the molded polymeric component also comprises a surface that has one or more colored surface regions defined by a second polymer distinct from the first polymer. A "colored" surface finish includes exhibiting a color in the visible wavelength range, which has a degree of contrast in opacity and/or color spectrum as compared to other surface regions (particularly from the metallized surface regions). In certain aspects, a colored surface region may correspond to non-metallized regions, so that the colored regions are substantially free of metallization. The colored region(s) can optionally cover an entire major surface of the molded component or alternatively, may cover discrete and distinct regions along the surface, for example, to define one or more visible features or patterns. In certain embodiments, the decorative molded polymeric component thus comprises a colored second polymer that defines at least one colored region of the decorative component's surface so that it has a colored surface finish, where the polymer forming the colored regions is resistant to metallization, like metal-plating, and preferably is not metallized. In certain variations, multiple colored polymers are used to define two or more distinct colored surface finishes corresponding to multiple non-metallized surface regions.

In various embodiments, the first polymer and the second polymer of the polymeric component are formed by injection molding a first resin and a second resin. In certain preferred aspects, the polymeric component is formed via a multi-shot injection molding process that will be described in greater detail below. A "resin" as used herein is an organic material, typically of high molecular weight, such as a polymer, which may be a polymer precursor, for example, monomers and/or oligomers capable of subsequent cross-linking or further reaction, or may comprise a cross-linked or cured polymer. In certain aspects, resins exhibit a tendency to flow when subjected to stress, thus, may be a liquid or viscous polymer or polymer precursor that is capable of being injected into a polymer injection mold cavity. In certain variations, a curing process transforms the resin into a polymer by a cross-linking process.

Thus, in various aspects, the first polymer and the second polymer are integrally formed and thus create a single, unitary body, for example, formed by multi-shot injection molding of the first resin and second resin in the same process, so that they are bonded or fused together. Thus, after multi-shot injection molding formation of the first and second polymers, a multi-polymeric component is formed containing both the first and second polymers, which has one or more metallized surface regions and one or more colored non-metallized surface regions. The molded multi-polymeric component optionally has at least a portion of the one or more metallized surface regions and at least a portion of the one or more colored surface regions visible to an external environment, so that it is particularly suitable as a decorative component.

In certain embodiments, the molded polymeric component optionally comprises a plurality of distinct polymers. The plurality of distinct polymers may form distinct surface regions that may be mutually exclusive and non-overlapping or alternatively may completely or partially overlap. For example, the present disclosure contemplates a plurality of first polymers that can be metallized and a plurality of second polymer that are resistant to metallization and may have different colors. In certain variations, one or more of the polymers that forms the molded polymeric component is stable in the presence of ultraviolet (UV) electromagnetic waves.

In yet other variations, the present teachings provide a plastic or polymeric component that comprises a first metal-platable polymer formed from an injection-molded first resin, for example, an injection-molded metal-platable resin. The first polymer has a first surface comprising one or more metallized regions. The decorative molded polymeric component also comprises a second injection-molded polymer that is formed from a second resin can be colored, but resistant to metallization. The second polymer has a second surface comprising one or more colored regions. Further, the second polymer is integrally molded with the first polymer via the injection molding process and one or more interface regions are formed where the first polymer contacts the second polymer.

Optionally, the decorative molded polymeric component may comprise one or more protective layers formed over the surface of the decorative component defining the both the metallized surface finish and the colored surface finish. In certain variations, such a protective layer comprises a transparent polymer, such as a UV-stable transparent polymer. Thus, the decorative molded polymeric component also optionally comprises a third polymer. In certain variations, a layer comprises a third polymer that is formed by a third transparent resin, which can be injection-molded. Such a third polymer may be disposed adjacent to at least one of the first or second polymers to serve to protect the underlying first and second polymers from exposure to an external environment. In certain aspects, the transparent resin forming the protective layer may cover or encapsulate one or more edges or interfaces defined between the first or second polymers or between the metallized and colored surface finishes. Preferably, at least a portion of one or more metallized regions and at least a portion of the one or more colored regions are visible to an external environment.

Thus, in preferred variations, a molded decorative component of the present teachings is formed by an injection molding process, which is typically an automatic process where a hydraulic press can be used (e.g., a hydraulic press that is generally horizontally-oriented), where the molding resin(s) is screw injected into one or more closed mold cavities (optionally having one or more cores disposed therein) via a sprue and a system of gates and runners. Pressure is then applied at the appropriate temperature to solidify the part. The mold is opened for part ejection and removal, the mold is closed, and the next charge is injected by the screw.

By way of non-limiting example, an exemplary simplified injection molding process configured for multi-shot injection molding is shown in FIG. 10. A mold assembly 508 comprises two primary components, the injection mold (A plate, 510) and the ejector mold (B plate, 520). Plastic resin (usually fed to a hopper 522 as pellets) enters a screw conveyor 524, which includes a heater 526 that applies heat to the resin material. The resin passes through the screw conveyor 524 to a first sprue 528 to apply heat to the resin while it is pressurized and fed via screw conveyor 524. The resin enters a cavity 530 in the mold 508 through the first sprue 528. As shown, sprue 528 directs the molten plastic resin to a plurality of open channels or runners 532 that are formed (e.g., by machining) into the faces of the A and B plates 510, 520 and lead to the cavity 530 defined by the mold assembly 508. The molten resin flows through the first runners 532 and enters one or more specialized gates 534 to enter into the cavity 530 to form the desired part having a shape defined by the cavity.

The mold assembly 508 can be heated and/or cooled in different regions through external control systems (with heat transfer channels or heating elements built into the mold and/or ejector, not shown in FIG. 10). The mold assembly 508 is usually designed so that the molded part reliably remains on the ejector side (B plate, 520) of the mold assembly 508 when it opens, and draws the portions of first runners 532 and the sprue 528 filled with resin out of the plate A side 510. The molded component is then readily ejected from the plate B 520 side. The molded component is removed from the runner system by ejection from the mold assembly 508, for example, by ejection from plate B side 520. Ejector pins 540, also known as knockout pin, include one or more circular pins placed in either half of the mold assembly (usually the ejector half 520), which pushes the finished molded product, or runner system out of the mold assembly 508.

Two-shot or multi-shot molds are designed to "overmold" within a single molding cycle and can be processed on specialized injection molding machines having two or more independent injection units. Multi-shot injection molding includes separate injection molding processes performed multiple times. For example, in a first step, an initial resin is molded into a first cavity or first region or volume of a cavity to form a molded article having a basic shape. Then, a second material is injection-molded into the remaining open spaces (for example, defining a second cavity or void region within the first cavity around the first region). The void space is then filled during the second injection step with a distinct resin material and thus forms a second molded article comprising both the first molded resin material and the second molded resin material integrally formed into a single molded component. In certain variations, the first and second cavities are substantially separated from one another (independent cavities defined in the mold assembly); although such separate cavities may have some interconnection points or openings between them to facilitate interconnection, fusing, or bonding of the polymeric parts together.

In various aspects, a molded decorative component of the present teachings can be formed by multiple-shot injection molding. "Multiple-shot injection molding" refers to an injection molding process for forming a molded polymeric article formed by first forming a predetermined shape by a primary molding of a first or initial resin composition to give a first molded portion of the article, and integrally molding at least one other resin composition in contact with the initial resin composition. Integral molding refers to forming a first molded article comprising a first molded material from a first molding process that is combined with a second molding process that adds one or more supplemental molded materials in contact with the first molded article thereto, thus forming an integral, monolithic second molded article comprising both the first molded material and the supplemental molded material(s) interconnected together.

As shown in the simplified schematic of FIG. 10, a multi-shot injection system includes a first sprue 528 that leads to a plurality of first channels/runners 532 and plurality of first gates 534 into the mold cavity 530. When the initial resin is injected into the mold cavity 530, it may only occupy a first portion of the cavity (see for example, the area or volume designated 550 in the cavity 530). The first sprue 528, the first runners 532, or first gates 534 may optionally comprise one or more valves or other means to prevent resin flow (shown in FIG. 10 as a valve 552 in sprue 528). As appreciated by those of skill in the art, the placement and number of sprues, runners, gates, and valves is not limited to exemplary embodiment shown here. A second sprue 560 leads to a plurality of second runners 562 that end in a plurality of second gates 564, which open to mold cavity 530. Different materials can be fed to the same hopper 522 and screw feeder assembly 524 in this molding apparatus configuration, although in alternative embodiments, the feeding systems may be independent from one another (including independent hoppers, screw feeders, sprues, and the like). During the process of feeding of the initial resin to the mold cavity 530, first valve 552 in first sprue 528 is open, while a second valve 568 in the second sprue 560 is closed to permit the initial resin to flow into the first runners and first gates 532, 534. Then, a first valve 552 is closed and the second valve 568 is opened. A later-injected resin can then be fed through the open valve 568 to the mold cavity 530 via sprue 560, second runners 562, and second gates 564. The later-injected resin enters the remaining void regions of the cavity 530 (for example, in the unoccupied regions surrounding area 550) and thus is over-molded to the initial resin material to form an integrally molded multi-polymer component.

The most simplified multi-shot injection process is a "two-shot" injection molding for two distinct resins; however, injection of multiple resins in excess of two is also contemplated. Further, integral molding of the same or other resin compositions can also be carried out in contact with a previously molded composition of the article to build upon and create yet another article. In certain alternative embodiments, a mold cavity may have distinct gates and runners for injection of the distinct resins, so that the mold can be rotated to connect a sprue delivering the resin to a different introduction point in the mold. In this manner, the delivery system described just above can be used where the first sprue 528 is connected to a first introduction point in the rotatable mold (not shown) and then after introduction of the initial resin, the mold is rotated. Then, second sprue 560 is connected to a different introduction point in the rotatable mold to deliver the subsequent resin. Alternatively, a single delivery system can optionally be used where the initial resin and later-injected resin are delivered in a common sprue. The resins can be alternated so that after the mold is filled with the initial resin, the mold is rotated; the resin being fed is switched to the subsequent resin delivered to a different introduction point in the mold by the same delivery system.

The final multi-shot molded article thus formed is preferably subjected to cross-linking or curing (for example, while still contained in the injection mold assembly). An article or component formed by the multi-shot polymer injection techniques taught in the present disclosure preferably has at least two distinct surface regions, each having different metallization characteristics, so that the component can be simultaneously exposed to metallizing conditions. For example, a multi-shot molded article can be exposed, submerged or partially dipped into a bath of metallization liquid composition. Such metallizing can include optionally subjecting the multi-polymeric component to etching, a catalyst, or other treatments as a pretreatment for metallizing (one or more times) of the final molded article, if desired, to form a metallized region containing a metal material. Thereafter, only one of the two distinct surface regions of the multi-polymeric component has a metallized surface finish applied, while the other of the two surface regions is substantially free of metallization.

Thus, in various aspects, the present disclosure provides methods for forming a decorative molded polymeric component. For example, as shown in FIG. 5, in certain embodiments, the methods of the present teachings include initially injection molding a second colored resin (which preferably forms a second polymer that is resistant to metallization, especially resistant to deposition of metals during metal-plating), followed by injecting a first metal-platable resin (that forms a first metal platable polymer) within a multi-shot injection molding process to form a molded piece having a first polymer with a metal-platable surface region and a second polymer with a colored surface region.

As discussed above, typically in multi-shot polymer injection molding, an initial resin is injected into a first gate of a mold that defines a first cavity (or multiple first cavities). The initial resin is injected to fill the first cavity of the mold. The mold also defines a second cavity (or multiple second cavities). Then, a subsequent resin is injected into the mold. In certain aspects, the second cavity is designed to contact the first cavity in specific regions, so that the subsequent resin is over-molded onto the initial resin occupying the first cavity. In accordance with certain aspects of the present teachings, the initial resin injected into the first cavity is the one that forms the second non-metallizable polymer, while the subsequent resin injected into the second cavity of the mold is the one that forms the first metal-platable polymer. The first and second cavities may optionally be designed to have one or more locking features to secure the first polymer formed from the initial resin to the second polymer formed from the subsequent resin.

In certain preferred aspects, the resin compositions that are used in the present methods can have different melting or transition point temperatures (e.g., in the case of polymers, such a melt temperature may reflect a glass transition point temperature or a softening temperature, for example, a temperature at which the polymer transforms from a crystalline or semi-crystalline structure to an amorphous structure). It is desirable to mold the subsequent resin composition at a temperature that is lower than the melt temperature of the first molded composition. During molding, partial softening and/or melting at the areas where the two materials are in contact can promote adherence and bonding of the two materials. In certain variations, the contacting surfaces of the molded compositions can be designed with features to improve the bond strength between the contacting surfaces of the integrally molded materials. For example, one molded material surface can have one or more channels, locking features, ridges, pits, buttons, holes, pores, tunnels and the like, including any structures or bonding known to those in the injection molding arts.

In certain aspects, the initially-injected resin has a higher melt flow rate and/or melt flow index than a later-injected resin, which is injected and fills the first cavity of the mold prior to introduction of the later-injected resin. The later-injected resin has a lower melt flow rate and/or melt flow index than the initially-injected resin, which is injected after the initially-injected resin into the mold. In this regard, the later-injected resin will be molded over the initial resin (so that they are integral and coupled with one another by interlocking or bonding together), but is injected at a lower temperature that will not melt or otherwise undesirably physically distort the shape of the first piece formed by the initial resin having the higher melt flow rate and/or melt flow index.

Therefore, in certain variations, the molding of separate compositions can be done at different melt temperatures or different mold injection temperatures. Preferably, the difference of melt temperatures of the initial and subsequent resins or different in mold injection temperatures is at least about 25° Celsius. The mold temperature may be the same for the one, two, or more mold cavities, or it may be different.

In one embodiment, a first molded article is molded of a initial resin composition having a first melting or maximum injection temperature, and the later molding (of the later-injected resin(s) compositions) is made at an injection temperature at least 50° Celsius lower than that melting temperature or injection temperature of the initial resin composition of the first molded article. In other embodiments, the first molding injection temperature or resin melting point is greater than or equal to about 55° C.; optionally greater than or equal to about 60° C.; optionally greater than or equal to about 70° C.; optionally greater than or equal to about 80° C.; optionally greater than or equal to about 90° C.; optionally greater than or equal to about 100° C.; optionally greater than or equal to about 115° C.; optionally greater than or equal to about 125° C.; optionally greater than or equal to about 150° C.; and in certain aspects, optionally greater than or equal to about 175° C. higher than that melting temperature or injection temperature of the later-injected resin composition that forms the second molded article.

In other variations, viscosity can be used to determine flow properties (other than molecular weight and melting point/transition temperatures). For example, the melt flow index (MFI) is related to molecular weight of the polymer and measures how much a resin material flows through an orifice over a given time period under a constant pressure. More specifically MFI is defined as the mass of polymer (e.g., resin), in grams, flowing in ten minutes through a capillary of a specific diameter and length by a pressure applied via prescribed alternative gravimetric weights for different prescribed temperatures. The method is described in the similar standards ASTM D1238 (Standard Test Method for Melt Flow Rates of Thermoplastics by Extrusion Plastometer) and ISO 1133 (Plastics—Determination of the melt mass-flow rate (MFR) and the melt volume-flow rate (MVR) of thermoplastics).

MFR is similar to MFI and is an indirect measure of molecular weight, with high melt flow rate corresponding to low molecular weight. At the same time, melt flow rate is a measure of the ability of the material's melt to flow under pressure. Melt flow rate is inversely proportional to viscosity of the melt at test conditions, although viscosity for any such material depends on the applied force. Generally, lower viscosity resins require lower temperatures during injection molding and higher viscosity having the highest molding temperatures.

Accordingly, in certain embodiments, the initial resin composition can have a melt flow rate of greater than or equal to about 10 g/10 minutes to less than or equal to about 30 g/10 minutes; optionally from greater than or equal to about 12 g/10 minutes to less than or equal to about 20 g/10 minutes; optionally from greater than or equal to about 12 g/10 minutes to less than or equal to about 15 g/10 minutes, as measured under standard temperature and applied force conditions (e.g., per ASTM D1238). Similarly, in certain embodiments, the later-injected resin composition has a melt flow rate of greater than or equal to about 2 to less than or equal to about 10 g/10 minutes; optionally greater than or equal to about 3 to less than or equal to about 7 g/10 minutes; optionally greater than or equal to about 3 to less than or equal to about 5 g/10 minutes as measured under standard temperature and applied force conditions (e.g., per ASTM D1238).

Once the molded component is pre-formed via multi-shot injection molding, in certain preferred variations, cross linking of the resins is performed to facilitate bonding of the initial resin material to the later-injected resin material and to form the first polymer and second polymer therefrom. In certain preferred aspects, cross-linking occurs by heating the first and later-injected resins during the injection molding process or heating the mold plates while the resins are being held in the mold assembly (prior to de-gating the component).

Cross-linking can also occur by applying actinic radiation, such as X-rays, gamma rays, ultraviolet light, visible light or alternatively, electron beam radiation, also known as e-beam. Ultra-violet radiation (UV) typically includes radiation at a wavelength or a plurality of wavelengths in the range of about 170 nm to 400 nm. Ionizing radiation typically includes means high energy radiation capable of generating ions and includes electron beam radiation, gamma rays and x-rays. E-beam means ionizing radiation of an electron beam generated by Van de Graff generator, electron-accelerator, x-ray, or the like. Such radioactive cross linking can occur at elevated temperature such as when both initial and subsequent resin materials are placed together at above the melting point of either component or at room temperature or at any temperature there between.

In accordance with certain aspects of the present teachings, the initially injected resin is referred to herein as the second resin that forms the second polymer, while a first resin is later injected into the mold to form the first polymer after the initial resin has been introduced. This injection sequence for multi-shot injection better enables formation of the concealed interface regions in the second polymer formed by the second (initially introduced) resin, prior to introducing the first resin to form a first polymer that complements the concealed interface regions features, which will be discussed in more detail below. The first resin forms a metallizable polymer, such as a metal-platable polymer. The second resin is selected so that it forms a second polymer that is resistant to metallization and preferably defines a colored non-metallized surface finish. The specific polymeric/resin materials will be in more detail below. It should be further noted that multiple resins, whether selected to be metal-platable resin or resins resistant to metal plating, can be injected sequentially into the mold to form a component having various distinct surface finishes or to provide protective layers in certain variations. In other words the number of resins is not limited to a single first resin, a single second resin, and optionally a single third resin, but rather may include a plurality of resins, including a plurality of distinct first resins, a plurality of distinct second resins, and a plurality of third resins.

After injection molding and preferably cross-linking, the first and second resins in the mold 310, 312 form a first polymer and a second polymer. Then, the integrally formed multi-polymer component is de-gated and removed from the injection mold 320. Then, the multi-polymer component is racked 322 and metallized at 324. The metallizing may be done by any known technique, including electroless or electrolytic deposition.

In preferred aspects, metallization occurs predominantly or exclusively on a surface of one polymer composition (the first metal-platable polymer formed from the first metal-platable resin), while is substantially absent from the surface of another polymer composition (the colored and/or transparent polymers formed from the second and/or third resins that are resistant to metallization). In another aspect, contiguous metallization is found on a portion of a surface of the polymeric component along the metallizable polymeric composition, while the surface of non-metallizable resin is resistant to metallization and is substantially free of metal.

For example, after racking at 322, the multi-polymer molded component may optionally be plated with one or more metals in an electroless bath and electroplating deposition bath 324, such as those conventional plating techniques described above. By way of example, one particularly suitable metallization process includes etching, followed by an electroless plating process, and then a wet chemistry metallization bath to apply a chrome metal finish to the plastic surface.

By further way of example, one particularly suitable metallization process includes wet etching, followed by an electroless plating process, and then a wet chemistry metallization bath to apply a chrome metal finish to the plastic surface, as described previously above. In one variation, etching is conducted by immersing the surface (or entire plastic component) in an etching solution comprising chromium (e.g., Cr (VI)) and sulfuric acid. While not limiting the present teachings to any particular theory, it is theorized that wet etching increases surface roughness and surface area of the metal-platable first polymer. For example, the etching solution is believed to remove or react with some of the butyl diene groups at the surface of the first polymer. Meanwhile, the metallization-resistant polymer does not experience such physical changes on the surface. Such an etching step altering the surface properties of the surface of the metal-platable first polymer enhances deposition of metal-containing material(s) thereto, while the second polymer remains largely resistant to any metallization processes.

For example, in one embodiment, after etching, the surface of the plastic component to be metallized (or the entire component itself) is subjected to an electroless plating process, which is an auto-catalytic process that includes applying a thin conductive metal layer onto the etched plastic surface without the use of electric current. In certain aspects, the electroless bath may contain and deposit metal elements selected from the group consisting of: nickel (Ni), copper (Cu), and combinations thereof. In addition to deposition of such metallic elements, a non-metallic element can be co-deposited with the metal (for example phosphorous (P) or boron (B)). In one embodiment, such an electroless bath may comprise a medium phosphorus electroless nickel bath (comprising about 7% phosphorus (P)).

After electroless deposition of such a conductive metal layer, the surface to be plated can be further subjected to wet chemistry processing, which is well known in the art. One exemplary wet chemistry electroplating process that forms a chrome-plated surface on the plastic component, includes electroplating first a copper (Cu) layer over the electroless-deposited layer comprising phosphorus and nickel, followed by electroplating a nickel layer (Ni) and then a chromium (Cr) layer. In such a wet chemistry process, the following non-limiting steps can be used to metallize the surface of the plastic component (after etching and electro-less deposition) via contact with or preferably immersion in baths or plating solutions. For example, several distinct plated layers of copper (Cu) metal can be applied sequentially, followed by acid activation. Then, several nickel (Ni)-plated layers can be applied over these Cu plated layers. The final Ni-plated layer can then be activated by a Cr bath, where a Cr plate is deposited. This Cr plating is then followed by a caustic stripping and then an acid stripping process to form a metallic region on the polymer surface having a chrome appearance.

A metallization process can also include a variety of metallization-promoting ingredients, which are known in the art to achieve metallization faster, achieve improved adherence or thickness, or so that metallization can be conducted at lower temperatures, and the like. Metallization-promoting ingredients can include salts, fillers, crystals, polymers, hydrophilic polymers, amide polymers, clays, minerals, calcium carbonate, and amide polymers, by way of non-limiting example.

Therefore, the molded multi-polymer piece is metal plated in one or more surface regions corresponding to the first metal-platable polymer to create a metallized surface. After the plating process 324, the surfaces of the regions comprising the metal-platable polymer have a metallized surface finish, as where at least one colored surface remains in regions corresponding to the second polymer resistant to metallization, which remains intact having a colored surface finish where metal is absent or only a minimal amount of non-visible metal is applied thereto. The multi-polymer molded component is the un-racked at 326.

Then, the multi-polymer plastic decorative component can optionally be finished and assembled (if necessary) 328, for example, by buffing the finished surfaces, which may involve buffing rough edges occurring due to the metallization process, and optionally applying an adhesive to a surface of the multi-polymer component that will be coupled to a substrate in the final application or use of the component. Finally, the assembled multi-polymer molded component is packed for distribution at 330.

In one aspect of the present disclosure, a multi-polymer plastic decorative component 350 formed in accordance with the present teachings, such as the process described above and shown in FIG. 5 and described above is set forth in FIGS. 6A-B. The polymeric component 350 includes a metal-platable polymer 352 defining at least one region 354 of a surface 356 of the component 350 that is metallized. The multi-polymer plastic decorative component 350 also has a colored polymer 358 that defines at least one colored surface region 360 (designated by "x" in FIG. 6B) of surface 356, where the colored polymer 358 forming the colored polymer surface region 360 is resistant to metallization (and further is preferably substantially free of metal-plating). The metallized surface region 354 may be seen from a viewing perspective (designated by "y" regions) in the surrounding environment 362 adjacent to the colored surface region 360 ("x" regions). Together, the first metal-platable polymer 352 and the colored polymer 358 define the surface 356 of the component that can be viewed from the surrounding environment 362. As shown in the present embodiment, the first metal-platable polymer 352 and the colored polymer 358 are substantially flush with one another to form surface 356. As appreciated by those of skill in the art, such an embodiment is exemplary, because the first metal-platable polymer 352 and second colored polymer 356 can be multi-shot injected to form any number of different configurations, thus forming any number of designs by respective locations of metallized surface 354 and colored surface region 360.

As shown in FIG. 5 and as discussed above, a third resin may optionally be included in the injection molding process 314. Preferably, like the second resin, the third resin forms a polymer that is resistant to metallization, further is transparent and is optionally stable to UV radiation. In certain aspects, such a third transparent resin forms a third polymer that is a protective layer for the underlying polymers and materials.

In one embodiment, a multi-polymer plastic decorative component 400 formed in accordance with the present teachings, such as the process described above and shown in FIG. 5 is set forth in FIGS. 7A-7B, which includes a first metal-platable polymer 402 defining at least one region having a metallized surface 404. The multi-polymer plastic decorative component 400 also has a colored polymer 406 that defines at least one colored surface region 408, wherein the polymer forming the colored polymer 406 is resistant to metallization and is preferably substantially free of metal-plating.

FIGS. 8A and 8B depict a multi-finish plastic decorative component formed by multi-shot injection molding, where a first polymer 450 is formed with a first surface finish, like a metallized surface finish 452 (such as in the process discussed in the context of FIG. 1) and a second polymer 460 is formed with a second surface finish 462, such as a colored surface finish. As shown in the detail of FIG. 7B, an interface region 470 is formed between the first polymer 450 and the second polymer 460 where they contact one another during the injection molding process to form a boundary there between.

Where the interface region 470 is designed in the manner shown in FIG. 8B, it is possible the during the injection molding process the boundary between the two distinct polymers is not clean/delineated, so while multi-shot injection molding is desirable to integrally form the molded component, it can have a detrimental impact on aesthetics. For example, in FIG. 8B, the interface region 470 shows an aesthetic defect 472 where the first polymer 450 has migrated along and mixed with the second polymer 460 along visible surface 474. When the first polymer 450 is metallized, the metallized surface 452 extends beyond the desired clean line or boundary and can potentially form an uneven or rough line. Thus, aesthetic defects, like 472, in a decorative component can be an uneven, rough, or poorly delineated boundary or line between two polymers (often referred to as "treeing" defects), nodulation between the polymers, or other marring and the like, that detracts from the quality of the decorative component design and aesthetics.

In certain variations of the present disclosure, the decorative multi-polymer component is further improved to eliminate certain potential issues that may occur with conventional formation processes, for example, to conceal any potential aesthetic defects (like 472) that may occur in a multiple polymer injected polymeric molded component. For example, as shown in FIGS. 9A-9C, a first polymer 480 is injection molded and metallizable forming a metallized surface region 482. A second polymer 484 is colored/tinted and resistant to metallization and forms a colored surface region 486. An interface region 488 is formed where the first polymer 480 contacts the second polymer 484.

In accordance with the present teachings, the interface region 488 is concealed from a visible direction (arrow 490) to hide any potential aesthetic defects that might occur at the boundary between the first and second polymers 480, 484. In certain preferred aspects, the concealed interface region 488 is configured as shown FIG. 9B, where the second polymer 484 defines a first raised or stepped portion 492 and a second raised or stepped portion 494, which the first polymer 480 contacts. As appreciated by those of skill in the art, the stepped portions are not limited to only two distinct stepped portions, but rather may include a plurality of stepped portions formed in the second polymer 484. The first stepped portion 492 has a first height (for example, corresponding to vertical regions designated "a" and "b" in FIG. 9B) and the second stepped portion 494 has a second height (corresponding to vertical regions designated "a," "b," "c," and "d") which is greater than the first height. As will be described below, in certain variations, the first height of the first stepped portion 492 is preferably less than the second height of the second stepped portion 494, but also is related to the height of an opposing groove wall.

In certain variations, an overall first height of the first stepped portion is greater than or equal to about 0.25 mm and less than or equal to about 1 mm as measured from a first side 496 of the second polymer 484 to a second side 498 of the second polymer 484. In certain variations, the overall height of the first stepped portion is about 0.5 mm. In certain embodiments, a second height of the second stepped portion (again as measured from a first side 496 to a second side 498 of second polymer 484) is greater than or equal to about 1 mm; optionally greater than or equal to about 2 mm, and in certain aspects, greater than or equal to about 5 mm.

The concealed interface region 488 in FIG. 9B further comprises a groove 500 formed adjacent to the first stepped portion 492. The design of the groove 500 is configured such that any migration of the first polymer 482 with the second polymer 484 (see mixing zone 501) remains confined within a vertical plane (see 503) defined by the bulk of the first polymer 482 and therefore beneath the exposed regions of the first polymer 482, so that it is not present along the horizontal, visible surfaces (e.g., 486) of the second polymer 484 from the visible direction 486. Thus, the visible surface 486 of the groove 500 is substantially free of the first polymer after the multi-shot injection molding.

Further, in certain variations, the first groove wall 502 adjacent to the first stepped portion 492 has a height (measured from a bottom surface 506 of the groove 500 to an upper surface 496) that is less than the second opposite groove wall 504. As can be seen in FIG. 9B, angled line "f" extends from an upper terminal end of first groove wall 502 up towards an upper terminal end of second groove wall 504. The difference in height between first and second groove walls 502, 504 reflected by this angled line "f" across the groove 500, in combination with an optimized groove width, contributes to the interface region 488 being predominantly concealed (for example, concealed from 95% of the sight lines which the interface might be seen from the visible direction 490). Thus, in certain aspects, the height of the first stepped portion 492 is related to the height of groove wall 502, which is designed to be lower than the opposing groove wall 504 to provide maximized concealment of the interface region 488. In certain aspects, the first stepped portion 492 has a height measured from the bottom of the adjacent groove bottom 506 to its upper surface 496 of greater than or equal to about 0.1 mm to less than or equal to about 0.5 mm, optionally about 0.2 mm to less than or equal to about 0.4 mm, and optionally about 0.25 mm in certain embodiments.

Correspondingly, in certain aspects, the first groove wall 502 measured from the bottom of groove 506 has a height of less than or equal to about 0.5 mm (see dimension "b"), optionally less than or equal to about 0.4 mm, optionally less than or equal to about 0.3 mm, and in certain aspects, preferably about 0.25 mm, while the second groove wall 504 also measured from the bottom of groove 506 has a height of greater than or equal to about 0.25 mm (see dimension "b" and "c"), optionally greater than or equal to about 0.4 mm, and in certain preferred aspects, preferably about 0.5 mm. As can be seen in FIG. 9B, the second groove wall 504 is commensurate in height (see "a", "b," and "c") with a bulk portion 507 of the second polymer 484. The corresponding first groove wall 502 has a height corresponding to "b," which is lower in height than the second groove wall 504.

The groove 500 has a width measured from a first groove wall 502 adjacent to the first stepped portion 492 to a second groove wall 504 opposite to the first groove wall 502 (designated by "e" in FIG. 9B). As discussed above, the height of the groove walls 502, 504 and the groove 500 width impact the angle of the line "f," which is related to the sight lines from the visible direction 490. An optimized groove width contributes to the interface region 488 being predominantly concealed. In certain variations, a width of the groove 500 is preferably less than or equal to 0.75 mm and optionally less than or equal to about 0.5 mm. In certain variations, the width of groove 500 is greater than or equal to about 0.05 mm and less than or equal to about 0.5 mm, optionally greater than or equal to about 0.2 mm and less than or equal to about 0.5 mm. In certain aspects, the groove 500 has a width of greater than or equal to about 0.2 mm and less than or equal to about 0.3 mm, and in certain preferred variations the width of the groove 500 is 0.25 mm.

An alternative embodiment of a concealed interface region 450 is shown in FIG. 7B, where first polymer 402 contacts second polymer 406. Indeed, concealed interface region 450 actually includes two separate boundaries between the first and second polymer, namely first interface region 450A and second interface region 450B on a second opposite side to the first interface region 450. The concealed interface region 450 comprises three stepped portions, namely a first stepped portion 452, a second stepped portion 454, and a third stepped portion 456 defined by the second polymer 406 where it contacts the first polymer 402. The first and second stepped portions 452 and 456 are of the same height. The first stepped portion 452 forms the first concealed interface region 450A, while the third stepped portion 456 forms the second concealed interface 450B on the opposite side. The height of the second stepped portion 454 is greater than either of the first or third stepped portions 452, 456. The above discussion of exemplary dimensions of the stepped portions in the context of FIGS. 9A-9B is also applicable here (where the height of the first and third stepped regions 452, 456 is the same as the first stepped region 492 in FIG. 9B).

Further, a first groove 460 is formed adjacent the first stepped portion 452 and a second groove 462 is formed adjacent the third stepped groove 456. Again, the principles discussed in the context of the groove 500 are applicable to grooves 460, 462 here, including the exemplary dimensions and configurations. In this manner, interface regions 450A and 450B between first polymer 402 and second polymer 406 are concealed from a visible direction 462 to hide any potential aesthetic defects that may occur where the injection molded polymers join together.

Therefore, methods are provided by the present teachings to form molded metallized polymeric component that comprises a multi-shot injection molding of a first resin and a second resin. The first resin forms a first polymer that is metal-platable and the second resin forms a second polymer that is resistant to metallization. At least one interface region is created where the first polymer contacts the second polymer and this interface region is concealed from a viewable direction, which can hide or conceal any potential aesthetic defects occurring at a boundary between the first and second polymers. Further, in certain embodiments, every interface region formed between the first and second polymers in the molded polymeric component may be designed in the manner described above so that every interface region is concealed from a visible direction. This provides all of the visible boundaries between the first and second polymer to be desirably straight and delineated from one another, without detection of uneven boundaries or other potential aesthetic defects.

In various aspects, suitable polymers for forming the metal platable first polymer include: acrylonitrile-butadiene-styrene (ABS), polycarbonate (PC), acrylonitrile-butadiene-styrene/polycarbonate (ABS/PC), copolymers, equivalents, and combinations thereof. In certain preferred aspects, the first metal-platable polymer comprises acrylonitrile-butadiene-styrene (ABS). Suitable examples of such polymers include those commercially available as CYCOLOC™ MG37EPX-GY4A087, MC1300-GY6026, and MG37EP-GY4A087, which are ABS and ABS-PC copolymers commercially available from SABIC Innovative Plastics. Another suitable polycarbonate polymer is commercially available as TERLURAN™ BX 13074 from BASF, Corp.

In various aspects, suitable polymers for forming the second polymer include: a polycarbonate polymer (PC), an acrylic polymer, a methacrylic polymer, an acrylic copolymer, a methacrylic copolymer, and combinations thereof. One particularly suitable commercially available second polymer is a colored acrylic copolymer PLEXIGLAS™ V825 UVA acrylic resin sold by Arkema, Inc. which is a proprietary copolymer of ethyl acrylate and methyl methacrylate having UV resistance, a melt flow rate (MFR) of 3.7 g/10 minutes at 230° C., a specific gravity of 1.19, a tensile strength of 10,200 psi and an tensile elongation at break of 6%.

In various aspects, the second polymer is colored or tinted and resistant to metallization. In certain aspects, the second polymer may comprise one or more colorants (pigments, dyes, particles) to provide the desired color for the polymer. Suitable colorants include, but are not limited to, dyes and pigments. A pigment is generally an inorganic or organic, colored, white or black material that is usually substantially insoluble in solvents; while a dye, unlike a pigment, is generally soluble in a solvent or carrier. In certain aspects, a preferred colorant for the second polymer is a pigment.

By way of non-limiting example, suitable pigment colorants include by way of non-limiting example, pearlescent, iridescent, metallic flake, ultramarine pigments, effect pigments, fluorescent pigments, phosphorescent pigments, inorganic pigments, carbon black pigments, natural pigments, organic pigments, mixed metal oxide pigments, iron oxide pigments, titanium dioxide pigments, organic azo pigments (such as azo lake pigments, insoluble azo pigments, condensed azo pigments, and chelate azo pigments), organic polycyclic pigments (such as phthalocyanine based pigments, anthraquinone based pigments, perylene based pigments, perinone based pigments, indigo based pigments, quinacridone based pigments, dioxazine based pigments, isoindolinone based pigments, quinophthalone based pigments, and diketopyrrolopyrrole (DPP) based pigments), dyeing lake pigments (such as lake pigments of acid or basic dyes), azine pigments; and the like. Further, suitable colorants may include surface-treated pigments.

Likewise, a third resin forms a transparent protective polymer (which may be the same polymer as the second polymer, but lacking in colorants) and is selected from the group consisting of an acrylic polymer, a methacrylic polymer, an acrylic copolymer, a methacrylic copolymer, and combinations thereof. One particularly suitable commercially available second polymer is a transparent acrylic copolymer PLEXIGLAS™ V825 UVA acrylic resin sold by Arkema, Inc. which is a proprietary copolymer of ethyl acrylate and methyl methacrylate having UV stability/resistance.

In certain alternative embodiments, at least one of the polymeric compositions can contain a reinforcement material. The reinforcement material may include clays, fillers or fibers or the like, which may be used in combination with one another. For example, suitable fibers can include carbon fibers, glass fibers, and combinations thereof.

Thus, the present disclosure provides multi-polymer components having at least one metallized region and at least one colored and non-metallized region that are durable and resistant to corrosion and degradation from extreme weather conditions. While not limiting the present disclosure, in preferred variations, the multi-polymer component may be a decorative component for a vehicle such as an automobile, truck, van, motorcycle, snowmobile, jet ski, boat, and the like. Such decorative components include detailing and trim features, indicia of brands, logos, emblems, and the like, as well, as instrument panels and other interior design features. Furthermore, such components may be used in a wide variety of applications and are not limited to use merely in vehicles, but rather may be used in a variety of applications, including in components for consumer goods, domestic and industrial appliances, retail and point-of-sale applications, toys, reflector components, and the like.

The multi-injection molding processes of the present teachings are streamlined and more efficient than traditional methods of forming polymeric components having metallized regions and non-metallized regions, including molded components having relative complex designs. The multi-polymer components formed from these processes are durable, corrosion resistant, and yet have improved aesthetics exhibiting well defined metallized region(s) that are visibly distinct from one or more colored regions.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The following attachments, designated Appendices A-F, are incorporated by reference herein in their entirety and more particularly describe certain features and aspects of various embodiments of the present teachings.

What is claimed is:

1. A molded metallized polymeric component comprising:
    one or more metallized visible surface regions formed on a first injection-molded polymer that is metal-platable and one or more colored visible surface regions defined by a second injection-molded polymer that is colored and resistant to metallization, wherein the first injection-molded polymer and the second injection-molded polymer are integrally formed with one another and at least one concealed interface region is formed where the first injection-molded polymer contacts the second injection-molded polymer to provide a first stepped portion having a first height and a second stepped portion having a second height greater than the first height, wherein the first and second stepped portions are in contact with the first injection-molded polymer; and
    wherein the at least one concealed interface region further comprises a groove formed in the second-injection molded polymer adjacent to the first stepped portion.

2. The molded metallized polymeric component of claim 1, wherein each interface region created where the first injection-molded polymer contacts the second injection-molded polymer in the molded metallized polymeric component is concealed from a visible direction.

3. The molded metallized polymeric component of claim 1, wherein the groove has a width extending from a first groove wall adjacent to the first stepped portion to a second groove wall opposite to the first groove wall that is greater than or equal to about 0.2 mm and less than or equal to about 0.5 mm.

4. The molded metallized polymeric component of claim 1, wherein the groove comprises a first groove wall adjacent the first stepped portion and a second groove wall opposite to the first groove wall, wherein the second groove wall has a height greater than the first wall groove and the first groove wall has a height of less than or equal to about 0.5 mm.

5. The molded metallized polymeric component of claim 4, wherein the first groove wall adjacent to the first stepped portion has a height less than the second opposite groove wall.

6. The molded metallized polymeric component of claim 4, wherein the first groove wall adjacent to the first stepped portion has a height of about 0.25 mm and the second opposite groove wall has a height of about 0.5 mm.

7. The molded metallized polymeric component of claim 6, wherein the first polymer is selected from the group consisting of: acrylonitrile-butadiene-styrene (ABS), acrylonitrile-butadiene-styrene/polycarbonate (ABS/PC), and combinations thereof, and the second polymer is selected from the group consisting of: a polycarbonate polymer (PC), an acrylic polymer, an acrylic copolymer, a methacrylic polymer, a methacrylic copolymer, and combinations thereof.

8. A decorative molded metallized polymeric component comprising:
    one or more metallized visible surface regions formed on a first injection-molded polymer that comprise a chrome finish and one or more colored visible surface regions defined by a second injection-molded polymer that is colored and resistant to metallization, wherein the first injection-molded polymer is selected from the group consisting of: acrylonitrile-butadiene-styrene (ABS), acrylonitrile-butadiene-styrene/polycarbonate (ABS/PC), and combinations thereof and the second injection-molded polymer is selected from the group consisting of: a polycarbonate polymer (PC), an acrylic polymer, an acrylic copolymer, a methacrylic polymer, a methacrylic copolymer, and combinations thereof, wherein one or more interface regions are formed where the first injection-molded polymer contacts the second injection-molded polymer that are concealed from a visible direction to conceal any aesthetic defects formed at the boundary between the first and second injection-molded polymers, wherein the one or more concealed interface regions comprise a first stepped portion having a first height and a second stepped portion having a second height greater than the first height, wherein the first and second stepped portions are formed in the second injection-molded polymer and in contact with the first injection-molded polymer, wherein the at least one concealed interface region further comprises a groove adjacent to the first stepped portion formed in the second injection-molded polymer.

9. The molded metallized polymeric component of claim 8, wherein the groove has a width extending from a first groove wall adjacent to the first stepped portion to a second groove wall opposite to the first groove wall that is greater than or equal to about 0.2 mm and less than or equal to about 0.5 mm.

10. The molded metallized polymeric component of claim 8, wherein the groove comprises a first groove wall adjacent the first stepped portion and a second groove wall opposite to the first groove wall, wherein the second groove wall has a height greater than the first wall groove and the first groove wall has a height of less than or equal to about 0.5 mm.

11. The molded metallized polymeric component of claim 10, wherein the first groove wall adjacent to the first stepped portion has a height less than the second opposite groove wall.

12. The molded metallized polymeric component of claim 10, wherein the first groove wall adjacent to the first stepped portion has a height of about 0.25 mm and the second opposite groove wall has a height of about 0.5 mm.

* * * * *